(12) United States Patent
Hart

(10) Patent No.: US 6,792,055 B1
(45) Date of Patent: Sep. 14, 2004

(54) DATA COMMUNICATIONS RECEIVER WITH AUTOMATIC CONTROL OF GAIN OR THRESHOLD FOR SOFT DECISION DECODING

(75) Inventor: Billy D. Hart, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 569 days.

(21) Appl. No.: 09/621,805

(22) Filed: Jul. 21, 2000

(51) Int. Cl.[7] .............................................. H04L 27/08
(52) U.S. Cl. ...................... 375/345; 375/340
(58) Field of Search ................... 375/345, 340, 375/341, 262; 714/794, 795; 455/232.1, 234.1, 234.2, 235.1, 239.1, 240.1, 245.1, 242.2, 246.1, 247.1, 250.1

(56) References Cited

U.S. PATENT DOCUMENTS

| | | | | |
|---|---|---|---|---|
| 4,864,244 A | * | 9/1989 | Sasaki ........................ | 329/304 |
| 4,989,074 A | * | 1/1991 | Matsumoto ................. | 348/572 |
| 5,214,675 A | | 5/1993 | Mueller et al. ............... | 375/94 |
| 5,379,324 A | | 1/1995 | Mueller et al. ............... | 375/94 |
| 5,566,191 A | | 10/1996 | Ohnishi et al. .............. | 371/43 |
| 6,404,829 B1 | * | 6/2002 | Sonu .......................... | 375/345 |
| 6,480,528 B1 | * | 11/2002 | Patel et al. .................. | 375/148 |
| 6,510,188 B1 | * | 1/2003 | Isaksen et al. .............. | 375/345 |
| 6,556,636 B1 | * | 4/2003 | Takagi ........................ | 375/350 |

OTHER PUBLICATIONS

Advanced Hardware Architectures, Inc Application Note ANRS07–0795 "Soft Decision Thresholds and Effects on Viterbi Performance".

Qualcomm Application Note AN1650–2 "Setting Soft–Decision Thresholds for Viterbi Decoder Code Words from PSK Modems".

* cited by examiner

Primary Examiner—Phoung Phu
(74) Attorney, Agent, or Firm—Nathan O. Jensen; Kyle Eppele

(57) ABSTRACT

A data communications receiver incorporating soft decision error correction decoding and a means to set the amplitude or threshold for quantized soft decisions in a near-optimum manner to a soft decision decoder. In one embodiment the means for setting the amplitude or threshold measures the soft decisions from a quantizer and marks data bits as weak or strong. The gain or threshold is automatically adjusted to achieve a desired fraction if each marking. The desired fraction is chosen as the value that optimizes performance of the soft decision decoder.

18 Claims, 5 Drawing Sheets

DATA COMMUNICATIONS RECEIVER WITH AUTOMATIC CONTROL OF GAIN OR THRESHOLD FOR SOFT DECISION DECODING

BACKGROUND OF THE INVENTION

This invention relates to data communications and more specifically to control of gain, amplitude or threshold in a data communications receiver with soft decision decoding to obtain an optimum signal level into a soft decision decoder.

Data transmission and reception systems that operate on noisy channels use any of a variety of coding and modulation schemes known in the art. Many of these schemes allow a data communications receiver to make symbol decisions directly on the output of a demodulator and feed the decisions to an error detection or correction decoder. Improved performance in such a system is obtained by obtaining soft decision information about the reliability of those received symbols and using that information in the decoder.

If the decoder is implemented in hardware, it is important to conserve logic gates in the decoder by using the minimum acceptable number of bits of precision to represent the soft decision information. It is well known in the art that three-bit quantization produces nearly the same error rates as infinite precision soft decision decoding if the signal and noise amplitudes are appropriate for the quantization thresholds.

When a data communication receiver uses quantized soft decision information with an error correction decoder, some means must be used to set the amplitude of the signal at the quantization point. Too large or too small amplitude does not capture the full benefit from the soft decision information, resulting in more bit errors than the optimum amplitude setting. Amplitude control is typically achieved by automatic gain control circuits that require an amplitude detector or noise level measurement. In many cases, a simpler method of control is desirable.

The prior art generally uses an automatic gain control (AGC) circuit that operates to maintain a constant measure of either signal plus noise or noise alone. An Advanced Hardware Architectures, Inc Application Note ANRS07-0795"Soft Decision Thresholds and Effects on Viterbi Performance" indicates that a noise variance AGC is desirable, but that a signal plus noise AGC is easier to implement. A Qualcomm Application Note AN1650-2 "Setting Soft-Decision Thresholds for Viterbi Decoder Code Words from PSK Modems" states that the quantizer thresholds are based on noise alone and that the AGC should operate on noise. Practical AGC algorithms do not operate on noise alone but use signal plus noise or typically on signal alone. The application note illustrates a signal plus noise controlled feedback AGC.

U.S. Pat. No. 5,566,191 discloses a soft decision decoding method using a Viterbi decoder. The need to control the level of an input signal is described and a feedforward AGC rather than the more typical feedback AGC is disclosed. The AGC feeds forward a signal dependant on the amplitude of the received signal to correct soft decision likelihood metric values in the Viterbi decoder.

U.S. Pat. Nos. 5,214,675 and 5,379,324 disclose noise variance estimation for use in receiver that corrects for Rayleigh fading in a multipath channel.

What is needed is a simple gain control function to set the input to a soft decision decoder at a near-optimum level to obtain the best performance in a data communications system.

SUMMARY OF THE INVENTION

A data communications receiver incorporating soft decision decoding is disclosed. The data communications receiver includes a demodulator for demodulating an input signal, a means connected to the demodulator for producing strong and weak data symbols from the demodulated input signal and for controlling a desired fraction of strong and weak data symbols, and a soft decision decoder for receiving and decoding the strong and weak data symbols to produce a data output.

In one embodiment of the present invention, the means for producing the strong and weak data symbols from the demodulated signal may be a soft decision quantizer. The means for controlling the desired fraction of strong and weak data symbols to the soft decision decoder comprises a strong/weak indication function connected to the soft decision quantizer for providing strong and weak indications. An averaging function connected to the strong/weak indication function averages the strong/weak indications. A comparison function connected to the averaging function is used to compare the average of strong/weak indications to a desired fraction of weak signals to generate a gain error signal. A gain control function generates a gain control signal from the gain error signal received from the comparison function. A variable gain element connected to the input of the receiver and to the gain control function varies the gain with the gain control signal to maintain the desired fraction of strong and weak data symbols to the soft decision decoder.

In another embodiment of the present invention feed forward gain control is used rather than feedback. The demodulator provides a multiple bit digital word output indicative of the demodulated input signal. The means for producing strong and weak data symbols of the demodulated input signal and for controlling the desired fraction of strong and weak data symbols provided to the decoder comprises strong/weak indication functions, averaging functions, a threshold value, comparison functions, a logic function, and a bit shifter. Each strong/weak indication function has an input connected to a hard decision bit output from the demodulator and another input connected to another output bit of the demodulator. The averaging functions connected to outputs of the strong/weak indication functions average the strong/weak indications. A fixed threshold value is used to set a threshold to control the desired fraction of strong/weak indications. The comparison functions connected to the averaging functions and to the threshold value are used to indicate which strong/weak indications exceed the threshold. A logic function connected to the comparison functions is used to select an index number indicative of which strong/weak indications drop below a threshold and to generate a shift control signal. A bit shifter connected to the multiple bit digital word output of the demodulator and to the logic function receives the shift control signal to select bits from the demodulator that provide the desired fraction of weak and strong symbols to the soft decision decoder. The bit shifter functions as a gain control means.

In another embodiment of the present invention, the threshold is varied rather than the gain. The means for producing strong and weak data symbols of the demodulated input signal and for controlling the desired fraction of strong and weak data symbols further comprises a first greater/than test function, an absolute value circuit, a plurality of greater/than test functions, a threshold control function, and scaling functions. The first greater/than test function has a first input connected to the demodulator to receive the demodulated input signal and a second input connected to a reference to provide a hard decision indication. The absolute value circuit connected to the demodulator receives the demodulated input signal to provide an absolute value output of the demodulated input signal. In the plurality of greater/than test functions, each has a first input connected to the absolute value circuit output. A second greater/than test function in the plurality of greater/than test functions provides a strong/weak indication. The threshold control function is connected to the strong/weak indication to provide a variable threshold output level in accordance with the strong/weak indication. The scaling functions are connected to the variable threshold output and to a second input of the greater/than test functions. The scaling functions scale the thresholds to provide a desired fraction of strong and weak data symbols from the greater/than test functions to the soft decision decoder.

It is an object of the present invention to provide a means to set the amplitude or threshold for quantized soft decisions in a near-optimum manner.

It is an object of the present invention to set the amplitude or threshold for quantized soft decisions with a simple method of control.

It is an advantage of the present invention to measure the fraction of the soft decisions which mark bits as weak or strong and to adjust the gain to achieve a desired fraction of each marking.

BRIEF DESCRIPTION OF THE DRAWINGS

The invention may be more fully understood by reading the following description of the preferred embodiments of the invention in conjunction with the appended drawings wherein.

DETAILED DESCRIPTION

Figure 1:
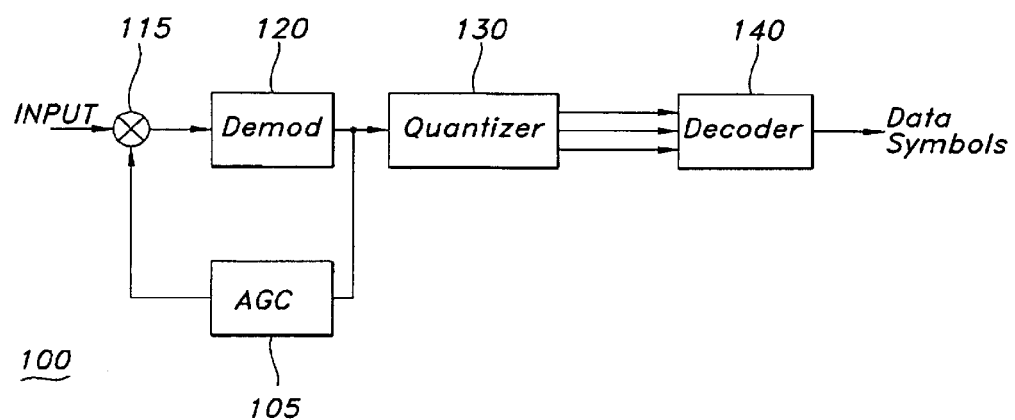
FIG. 1 is a block diagram of a data communications receiver employing soft decision decoding and an automatic gain control systems as is known in the art.

A data communications receiver 100 known in the art is shown in FIG. 1. An input signal to the receiver 100 may be an analog signal transmitted from a remote transmitter (not shown) that contains modulated digital data and error correction coding. The input to the data communications receiver 100 may be received from other stages (not shown) of the receiver such as intermediate frequency stages. The data communication receiver 100 may include a demodulator 120, a quantizer 130, and a decoder 140 for error detection and correction to produce a data output signal. In the example of FIG. 1, the demodulator 120 may be a PSK demodulator and the decoder 140 may be a Viterbi decoder. Other forms of modulation and error correction coding may be used. An automatic gain control (AGC) function may be incorporated in the receiver 100 to maintain a constant input level to the quantizer 130. The AGC may comprise an AGC block 105 that provides a gain control signal proportional to the signal level output from the demodulator 120 and a variable gain or scaling function 115 to vary the level of the input signal to the demodulator 120 as is known in the art.

Figure 2:
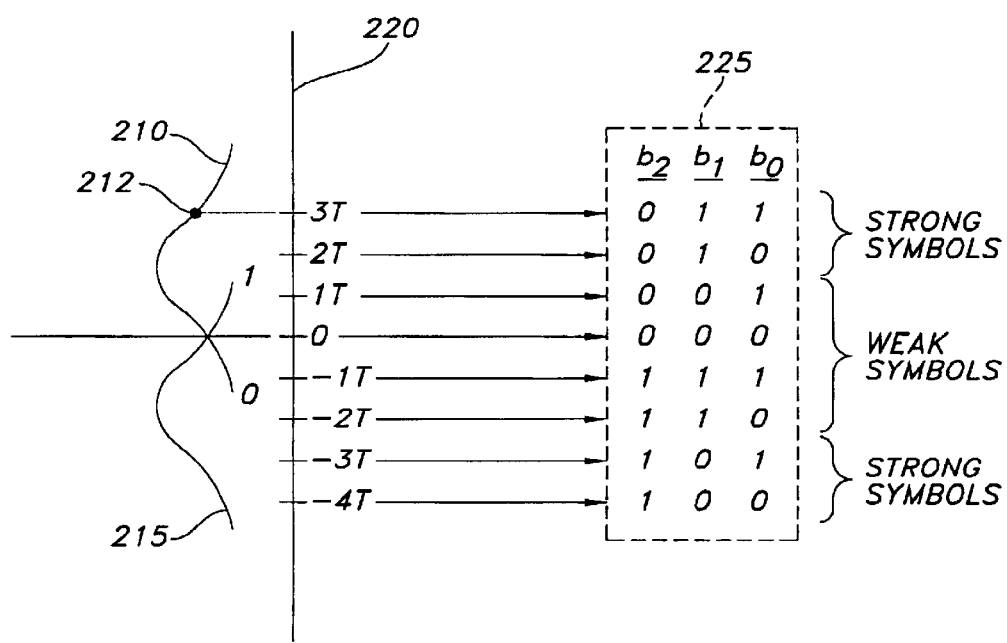
FIG. 2 is diagram showing the operation of a three-bit quantizer used in soft decision decoding systems.

In FIG. 1 the input data signal may be corrupted with Gaussian or other noise when received at the input of the receiver 100. The noisy input signal is demodulated in the demodulator 120 and sent to the quantizer 130. The quantizer 130 may be a two-level quantizer that determines whether the received signal with noise is a zero or a one thus making what is known in the art as a hard decision. The quantizer 130 may be a 1-bit analog to digital (ADC) converter. The output of the quantizer 130 is the passed to the Viterbi decoder 140 for processing. The decision made by the quantizer 130 may be in error due to the added noise. In FIG. 2 curve 210 shows the distribution of an input logic 1 signal with added Gaussian noise and curve 215 shows the distribution of an input logic 0 with added Gaussian noise. To reduce potential errors that exist in two-level hard decision quantization, the input signal may be quantized with greater than two levels. Adding additional levels of quantization to quantizer 130 provides the decoder 140 more information about the signal. With a three-bit quantizer 130, eight levels (three bits) are available that provide a level of confidence that the received signal is a logic one or a logic zero. Decoding in the decoder 140 with a quantizer with more than two levels is known in the art as soft decision decoding. With soft decoding decoder 140 becomes a soft decision decoder and quantizer 130 is referred to as a soft decision quantizer.

The output of the quantizer 130 in FIG. 1 is typically of limited precision, with three bits being the most common, in order to minimize the hardware needed in the soft decision decoder 140. A three-bit soft decision quantizer may be implemented as a 3-bit ADC. FIG. 2 shows operation of a three-bit quantizer. Scale 220 shows thresholds T of the three-bit quantizer for logic 1 (0, T, 2T, 3T) and for logic 0 (0, −T, −2T, −3T, and −4T). Table 225 on the right of FIG. 2 represents a soft decision output code from the quantizer 130 corresponding to an input signal represented by curves 210 and 215. For example if an input logic 1 plus noise point 212 on curve 210 is received, the signal is at threshold level 3T on the scale 220. This example condition corresponds to a soft decision code word 011 in table 225 of FIG. 2. A strong data symbol or bit may be represented by a soft decision code word 011 or 010 corresponding to 3T or 2T respectively in table 225 for logic 1 and 101 or 100 corresponding to −3T or −4T respectively for logic zero. The soft decision code words in-between the strong data symbols correspond to weak data symbols. The most significant bit $b_2$ in the table 225 may be a hard decision bit. A strong/weak symbol indication may be determined by the exclusive OR of $b_2$ and $b_1$ of table 225 in FIG. 2.

A high gain in the receiver before the quantizer 130 relative to current received signal and noise amplitudes, will produce mostly the largest positive (011) and negative values (100) at the quantizer 130 output and most of the data symbols will be labeled as strong. A low gain will produce mostly the smallest positive and negative values and most of the symbols will be labeled as weak. An optimum gain will produce a full range of quantized values. This discussion refers to values that are at least half of the maximum quantized value as strong and less than this value as weak. Other values may also be used.

An automatic gain control (AGC) function of some type is used with the data communications receiver 100 to produce the optimum gain. In FIG. 1 the AGC function includes AGC control block 105 and the variable gain function 115 as previously discussed. With additive white Gaussian noise, rate ½ coding, and three-bit quantization it has been determined that the threshold level T is best set to about $0.50\sigma_x$ where $\sigma_x$ is the standard deviation of the noise. The AGC function should keep the noise level at the soft decision quantizer 130 set at this level. For binary phase shift keyed (BPSK) modulation the threshold is $$T = 0.5\sqrt{N_{o/2}} \qquad \text{Equation 1}$$

where $N_0$ is the noise.

As previously discussed, prior art attempts at implementing an AGC have included noise AGC and signal plus noise AGC. Noise AGC offers the best performance but is difficult to implement so signal plus noise AGC or just signal AGC is commonly used.

Instead of using signal, noise, or signal plus noise to control an AGC to maintain a proper level into the quantizer, an embodiment of the present invention uses a measured fraction of strong and weak quantizer symbols in a feed back fashion to adjust the gain in such a way as to keep the optimum level into the quantizer. If more weak symbols are produced than desired, the gain is increased. If fewer weak symbols than desired are produced, the gain is decreased. Another embodiment of the present invention uses feed forward indications of strong and weak quantization symbols to select bits from a high-precision digital demodulator output to use as quantization outputs for the soft decision decoder 140. This can be viewed as feed forward gain control. Another embodiment of the present invention uses the strong and weak quantizer symbols to adjust quantization thresholds in the quantizer instead of gain in the receiver. These embodiments are described in the following paragraphs.

Figure 3:
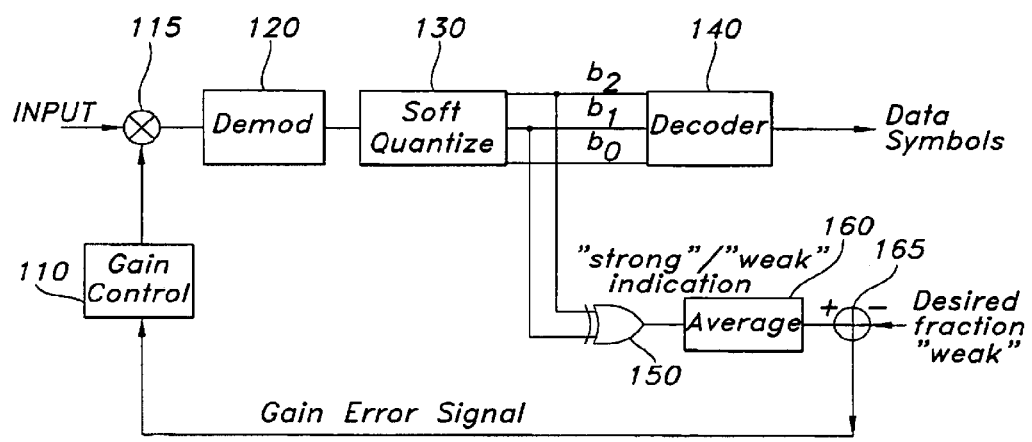
FIG. 3 is a block diagram showing an embodiment of a gain control circuit of the present invention using feedback to control the input amplitude.

A wide variety of implementations is possible for the mechanization of a gain control circuit in one embodiment of the present invention. A simple implementation of the first embodiment employing feedback is shown in FIG. 3. Portions of the block diagram of FIG. 1 are used in FIG. 3. Quantizer 130 Is a soft decision quantizer and decoder 140 is a soft decision decoder in FIG. 3 as described in conjunction with FIG. 1. In this embodiment, a strong/weak indication function 150 provides a strong/weak indication by using an exclusive OR logic gate operating on the bits $b_2$ and $b_1$ of the quantized soft decision value from soft decision quantizer 130 as shown in the table 225 of FIG. 2. An averaging function 160 averages the strong/weak indications by the accumulation of up and down indications in a counter. If a weak indication is given, the counter 160 counts up to increase gain In the receiver. The gain that is applied to the received input signal is proportional to the current counter value. The output of the counter 160 may have an offset subtracted at comparison function 165 to set a desired fraction of strong and weak symbols input to the soft decision decoder 140. The comparison function implementation may be used to adjust the fraction of weak symbols to approximately 50% or other desired value as discussed above.

The output of the comparison function 165 is a gain error signal that is passed to a gain control function 110. The gain control function may include a digital to analog converter (DAC) to convert the digital gain error signal into an analog error signal. The analog error signal may then be applied to a variable gain or scaling function 115 to vary the level of the input signal to the demodulator 120. The variable gain or scaling function 115 may be at the input as shown in FIG. 3 or at any location in the signal path of the receiver 100 such as between the input to the demodulator 120 and the antenna (not shown). The variable gain function may also be located after the demodulator 120 and before the quantizer 130. The scaling function 115 may be any variable gain control element used in AGC systems known in the art such as a field effect transistor (FET) amplifier or a digital signal processing (DSP) digital multiplier factor. By controlling the signal level input to the quantizer 130, the desired measured fraction of strong and weak data symbols to the soft decision decoder 140 is obtained.

The exact logic used to accomplish the detection of strong and weak symbols will depend on the number system used for representing the demodulator 120 outputs. Two's complement representation is primarily used in illustrating this invention but other forms such as sign and magnitude could accomplish the same results.

It is obvious that the principles of this invention apply to both binary and non-binary symbols, such as quadrature phase shift keyed (QPSK), so long as a quantized soft decision value is produced that is amplitude dependent.

Figure 4:
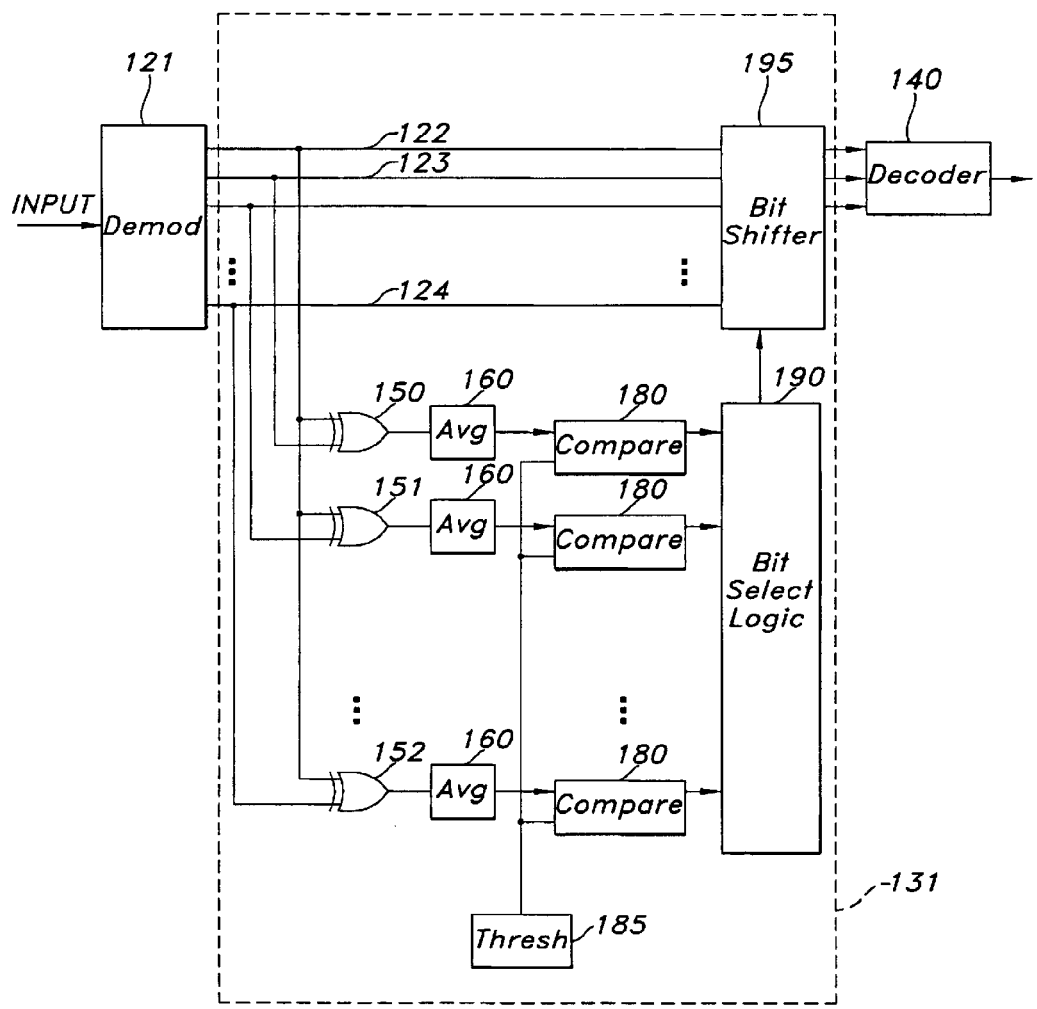
FIG. 4 is a block diagram showing another embodiment of a gain control of the present invention using feedforward to select soft decision bits to control the input to a soft decision decoder.

An alternate embodiment of the present invention that employs feedforward gain control is shown in FIG. 4. This embodiment feeds forward a determination of which bits in a high-precision digital output word to use as the quantized soft-decision bits in an n-bit quantization function 131. The embodiment of FIG. 4 utilizes three bits but other numbers of bits may be used. A demodulator 121 provides a multi-bit digital output word that has enough range to cover all signal and noise level variations of the input signal. Circuit functions within the block 131 replace the quantizer 130 of FIG. 3. Exclusive OR functions 150, 151, and 152 are connected to a sign bit hard decision output 122 and to each of the next lower order output bits of the demodulator 121 to provide strong/weak indications. An output on a strong/weak indication exclusive OR 150 connected to the hard decision bit 122 and exclusive OR 151 on the next lower order bit 123 provides a strong indication with a high signal input level. An output on the hard decision bit 122 exclusive OR 150 and a low order bit 124 exclusive OR 152 provides a weak indication due to a low signal input level. The outputs of the exclusive OR functions 150, 151, and 152 are connected to averaging functions 160 such as digital counters to average the exclusive OR outputs. The averaging functions 160 average the number of strong/weak indications to obtain a gain update at a rate lower than the data symbol rate. The outputs of the averaging functions 160 are connected to comparison functions 180 where the average counts are compared to a predetermined threshold value 185. The gain may be set for a block of data symbols independently from other blocks in this embodiment.

The outputs of each of the comparison functions 180 in FIG. 4 are connected to a bit select logic function 190. The logic function may be a conventional combinational logic circuit that selects an index number of the highest order bit from the demodulator 121 that drops below the threshold value 185 or exceeds the threshold value depending on the chosen number system. The output of the logic function 190 is connected to a shift control input of a bit shifter 195. The bit shifter 195 may be a commonly available multiplexer. The shift control is used to select the three output bits from the demodulator 121 that are to be used by the soft decision decoder 140. If the receiver gain is too high a large number of strong indications from the comparison functions 180 are obtained as indicated by the number of average count output levels that above the threshold 185. The bit select logic function 190 causes the bit shifter 195 to select higher order demodulator outputs to the soft decision decoder 140. The bit shifter 195 functions as a gain control by shifting the multiple bit digital word by a variable amount before providing it to the soft decision decoder 140. In this fashion, the desired measured fraction of strong and weak symbols to the soft decision decoder 140 is made. The threshold 185 is used to set the desired fraction.

Figure 5:
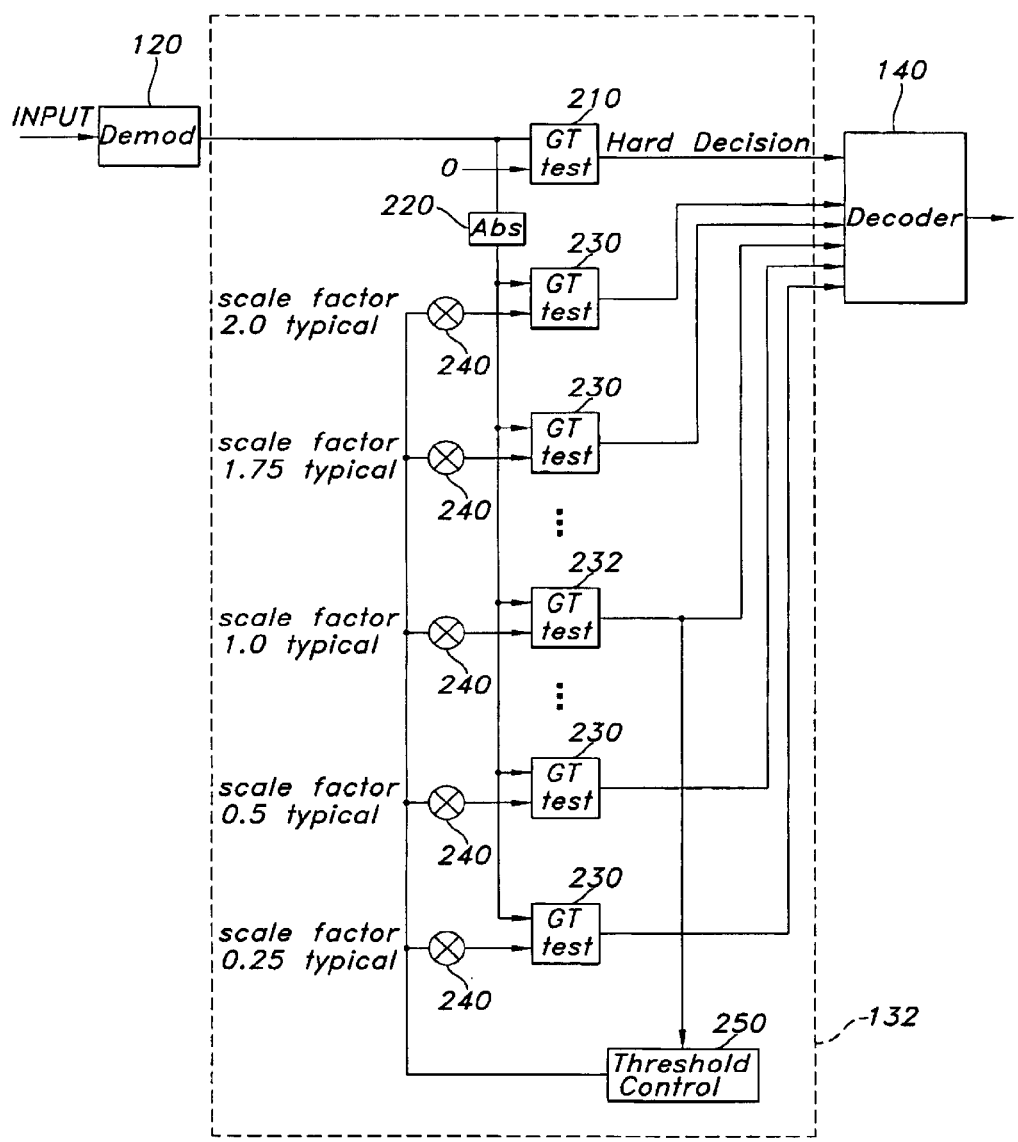
FIG. 5 is a block diagram showing another embodiment of a gain control of the present invention using feedback to adjust the thresholds of a quantizer.

Another embodiment of the present invention is shown in FIG. 5. This embodiment automatically adjusts the soft decision thresholds in a quantizer 132 using a feedback means rather than adjusting the gain before the quantizer 130 of FIG. 3 to achieve a desired fraction of strong and weak soft decision symbols. Circuit functions within the quantizer block 132 replace the quantizer 130 of FIG. 3. In FIG. 5, the output of the demodulator 120 is connected to a first "greater than" (GT) test function 210 that may be an analog or digital comparator known in the art. The output of the demodulator 120 is compared to a zero threshold level in the GT test function 210 to make a hard decision. If the input to the GT test function 210 is greater than zero, the hard decision bit value is a logic one as indicated by the GT function 210 output. The demodulator 120 output is also connected to an absolute value function 220 to convert all input levels to positive outputs to provide a measure of how strong or weak the data symbol is. The absolute value function 220 may be an operational amplifier circuit known in the art for analog circuit implementations or digital logic known in the art if the demodulator 120 produces multi-bit digital values. The output of the absolute value function 220 is connected to an input of a plurality of GT test functions 230 and a second GT test function 232 for comparison to a threshold. The plurality of GT test functions 230 may include three or more depending on the desired level of quantization. The output of the GT test functions 230 form the remainder of the soft decision outputs that together with the hard decision output from GT test function 210 are passed as the quantized soft decision symbol outputs to the soft decision decoder 140. An output from the second GT test function 232 is used as a strong/weak indication. This strong/weak indication is connected to a threshold control 250 that may an up/down counter. The output of the threshold control 250 is connected to the input of each of a plurality scaling functions 240. The other input of each of the GT test functions 230 and the second GT test function 232 is connected to the outputs of the scaling functions 240. Each scaling function 240 may be set to values that provide a range of thresholds that divide the range of demodulator output values into multiple subranges. Typically, values distributed over a range above and below unity will be used. The second GT test function 232 is near the middle of the input range from the demodulator 120 and has its threshold scaling function set at unity.

In FIG. 5 when the input signal level is high into the demodulator 120, the strong/weak indication from the second GT test function 232 provides a strong indication and the threshold control 250 counts up. The counter output may be used in digital form or converted to an analog signal with a digital to analog converter in the threshold control 250. The threshold increases as the counter counts up increasing the threshold level to the scaling functions 240. The threshold to the GT test functions 230 and the second GT test function 232 is increased thus reducing the percentage of strong indications. In this fashion, the desired measured fraction of strong and weak symbols to the soft decision decoder 140 is made as the input signal and noise levels vary.

It is believed that the automatic gain control for soft decision decoding of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A data communications receiver incorporating soft decision decoding, said data communications receiver comprising:

a demodulator for demodulating an input signal;

means connected to the demodulator for producing strong and weak data symbols from the demodulated input signal and for controlling a desired fraction of strong and weak data symbols; and a soft decision decoder for receiving and decoding the strong and weak data symbols to produce a data output.

2. The data communications receiver of claim 1 wherein the means for producing the strong and weak data symbols from the demodulated signal comprises a soft decision quantizer that indicates a level of confidence that the demodulated input signal is a logic one or logic zero with a strong data symbol and a level in-between logic one and logic zero with a weak data symbol.

3. The data communications receiver of claim 2 wherein the means for controlling the desired fraction of strong and weak data symbols comprises:

a strong/weak indication function connected to the soft decision quantizer for providing strong/weak indications;

an averaging function connected to the strong/weak indication function for averaging the strong/weak indications;

a comparison function connected to the averaging function to compare an average of strong/weak indications to obtain a desired fraction of strong and weak signals and to generate a gain error signal;

a gain control function to generate a gain control signal from the gain error signal received from the comparison function; and a variable gain element connected to a signal path of the receiver and to the gain control function to vary the gain with the gain control signal to maintain the desired fraction of strong and weak data symbols to the soft decision decoder.

4. The data communications receiver of claim 3 wherein the strong/weak indication function comprises an exclusive OR function having inputs connected to outputs of the soft decision quantizer and an output connected to the averaging function wherein said OR function provides an output signal for a strong indication and an opposite output signal for a weak indication.

5. The data communications receiver of claim 3 wherein the averaging function comprises a counter having an input connected to the strong/weak indication function and an output connected to the comparison function wherein said counter counts in one direction to increase gain with a weak indication and counts in an opposite direction to reduce gain with a strong indication.

6. The data communications receiver of claim 1 wherein the demodulator provides a multiple bit digital word output indicative of the demodulated input signal.

7. The data communications receiver of claim 6 wherein the means for producing strong and weak data symbols from the demodulated input signal and for controlling the desired fraction of strong and weak data symbols comprises:

a plurality of strong/weak indication functions each with an input connected to a hard decision bit output from the demodulator and another input connected to another output bit of the demodulator for providing strong/weak indications;

a plurality of averaging functions connected to outputs of the plurality of strong/weak indication functions for averaging the strong/weak indications;

a threshold value for setting a threshold to control the desired fraction of strong/weak indications;

a plurality of comparison functions connected to the averaging functions and to the threshold value to indicate which strong/weak indications exceed the threshold;

a logic function connected to the plurality of comparison functions to select an index number indicative of which strong/weak indications drop below a threshold and to generate a shift control signal; and a bit shifter connected to the multiple bit digital word output of the demodulator and to the logic function to receive the shift control signal to select bits from the demodulator that provide the desired fraction of strong and weak data symbols to the soft decision decoder.

8. The data communications receiver of claim 7 wherein the strong/weak indication function comprises an exclusive OR function having inputs connected to outputs of the soft decision quantizer and an output connected to the averaging function wherein said OR function provides an output signal for a strong indication and an opposite output signal for a weak indication.

9. The data communications receiver of claim 1 wherein the means for producing strong and weak data symbols from the demodulated input signal and the means for controlling the desired fraction of strong and weak data symbols further comprises:

a first greater than test function having a first input connected to the demodulator to receive the demodulated input signal and a second input connected to a reference to provide a hard decision indication;

an absolute value circuit connected to the demodulator to receive the demodulated input signal to provide an absolute value output of the demodulated input signal;

a plurality of greater than test functions with a first input of each of the greater than test functions connected to the absolute value output;

a second greater than test function with a first input connected to the absolute value output and for providing a strong/weak indication;

a threshold control function connected to the strong/weak indication for providing a variable threshold output level in accordance with the strong/weak indication; and a plurality of scaling functions connected to the variable threshold output of the threshold control function and to a second input of the plurality of greater than test functions and a second input of the second greater than test function for providing a desired fraction of strong and weak data symbols from the plurality of greater than test functions to the soft decision decoder.

10. A data communications receiver incorporating soft decision decoding and a gain or amplitude control for maintaining a desired fraction of strong and weak symbols comprising:

a demodulator for demodulating an input signal;

a soft decision quantizer for quantizing the demodulated input signal received from the demodulator into strong and weak data symbols indicative of a confidence level that the demodulated input signal is a logic one or zero or a level in-between logic one and logic zero;

a soft decision decoder connected to the soft decision quantizer for decoding the strong and weak data symbols;

a strong/weak indication function connected to the soft decision quantizer for providing a strong/weak indication from the strong and weak data symbols;

an averaging function connected to the strong/weak indication function for averaging the strong/weak indications;

a comparison function connected to the averaging function for comparing a desired fraction of weak signals and to generate a gain error signal;

a gain control function to generate a gain control signal from the gain error signal received from the comparison function; and a variable gain element connected to the input of the receiver and to the gain control function to vary the gain to maintain the desired fraction of strong and weak data symbols into the soft decision decoder.

11. The data communications receiver of claim 10 wherein the strong/weak indication function comprises an exclusive OR function having inputs connected to outputs of the soft decision quantizer and an output connected to the averaging function wherein said OR function provides an output signal for a strong indication and an opposite output signal for a weak indication.

12. The data communications receiver of claim 10 wherein the soft decision quantizer is a three-bit quantizer.

13. The data communications receiver of claim 10 wherein the averaging function is a counter.

14. A method of controlling an input to a soft decision decoder in a data communications receiver to produce a data output comprising the steps of:

demodulating an input signal;

producing strong and weak data symbols from the demodulated input signal with a soft decision quantizer;

indicating with the soft decision quantizer a level of confidence that the demodulated input signal is a logic one or logic zero with a strong data symbol and a level in-between logic one and logic zero with a weak data symbol;

controlling a desired fraction of strong and weak data symbols input to the soft decision decoder; and decoding the strong and weak data symbols input to the soft decision decoder to produce the data output.

15. The method of claim 14 wherein the step of controlling the desired fraction of strong and weak data symbols input to the soft decision decoder further comprises:

providing strong/weak indications from a strong/weak indication function connected to the soft decision quantizer;

averaging the strong/weak indications in an averaging function connected to the strong/weak indication function;

comparing a desired fraction of weak signals from the average of strong/weak indications to generate a gain error signal;

generating a gain control signal from the gain error signal in a gain control function; and varying gain with the gain control signal in a variable gain element connected to the input of the receiver to maintain the desired fraction of strong and weak symbols input to the soft decision decoder.

16. The method of claim 14 wherein the step of demodulating the input signal further comprises providing a multiple bit digital word output indicative of the demodulated input signal.

17. The method of claim 16 wherein the steps of producing strong and weak data symbols of the demodulated input signal and controlling the desired fraction of strong and weak symbols provided to the soft decision decoder further comprise:

provlding strong/weak indications from a plurality of strong/weak indication functions;

averaging the strong/weak indications with a plurality of averaging functions;

setting a threshold with a threshold value to control the desired fraction of strong/weak indications;

indicating which strong/weak indications exceed the threshold with a plurality of comparison functions connected to the averaging functions and to the threshold value;

selecting an index number indicative of which strong/weak indications drop below a threshold in a logic function connected to the plurality of comparison functions to generate a shift control signal; and selecting bits from the demodulator that provide the desired fraction of weak and strong symbols to the soft decision decoder with a bit shifter connected to the multiple bit digital word output of the demodulator and to the logic function in accordance with the shift control signal.

18. The method of claim 14 wherein the steps of producing strong and weak data symbols of the demodulated input signal and of controlling the desired fraction of strong and weak data symbols further comprises:

providing a hard decision indication in a first greater than test function with a first input connected to the demodulator to receive the demodulated input signal and a second input connected to a reference;

providing an absolute value output of the demodulated input signal with an absolute value circuit connected to the demodulator to receive the demodulated input signal;

providing a strong/weak indication from a second greater than test function in a plurality of greater than test functions with a first input of each of the plurality of greater than test functions connected to the absolute value output;

providing a variable threshold output level in accordance with the strong/weak indication with a threshold control function connected to the strong/weak indication; and providing a desired fraction of strong and weak data symbols from the plurality of greater than test functions to the soft decision decoder with a plurality of scaling functions connected to the variable threshold output of the threshold control function and to a second input of the plurality of greater than test functions.

* * * * *